(12) United States Patent
Wang et al.

(10) Patent No.: US 6,300,658 B1
(45) Date of Patent: Oct. 9, 2001

(54) METHOD FOR REDUCED GATE ASPECT RATION TO IMPROVE GAP-FILL AFTER SPACER ETCH

(75) Inventors: John JianShi Wang, San Jose; Kent Kuohua Chang; Hao Fang, both of Cupertino; Lu You, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/368,073

(22) Filed: Aug. 3, 1999

(51) Int. Cl.[7] .................................................. H01L 21/336
(52) U.S. Cl. .......................................... 257/321; 438/264
(58) Field of Search .............................. 438/264; 257/321

(56) References Cited

U.S. PATENT DOCUMENTS 5,508,543 * 4/1996 Hartstein et al. .
5,987,354 * 4/1999 Kachelmeier .
6,017,796 * 1/2000 Chen et al. .

* cited by examiner

*Primary Examiner*—George Fourson
*Assistant Examiner*—Joannie A Garcia
(74) *Attorney, Agent, or Firm*—Sawyer Law Group LLP (57) ABSTRACT

The present invention provides a method for reducing the gate aspect ratio of a flash memory device. The method includes forming a tunnel oxide layer on a substrate; forming a polysilicon layer on the tunnel oxide layer; forming an insulating layer on the polysilicon layer; forming a control gate layer on the polysilicon layer; etching at least the tunnel oxide layer, the insulating layer, and the control gate layer to form at least two stack structures; forming a plurality of spacers at sides of the at least two stack structures; and filling at least one gap between the at least two stack structures with an oxide, where the control gate layer provides a gate aspect ratio which allows for a maximum step coverage by the oxide. In a preferred embodiment, the method uses nickel silicide instead of the conventional tungsten silicide in the control gate layers of the cells of the device. Nickel silicide has higher conductivity than conventional silicides, thus a thinner layer of nickel silicide may be used without sacrificing performance. Nickel silicide also has a lower barrier height for holes, thus maintaining a low contact resistance. With a thinner nickel silicide layer, the gate aspect ratio of the cells are lowered, allowing for a maximum step coverage by the gap-filling oxide. The reliability of the device is thus improved.

2 Claims, 7 Drawing Sheets

METHOD FOR REDUCED GATE ASPECT RATION TO IMPROVE GAP-FILL AFTER SPACER ETCH

FIELD OF THE INVENTION

The present invention relates to flash memory devices, and more particularly to the gap filling between cells after a spacer etch.

BACKGROUND OF THE INVENTION

Figure 1:
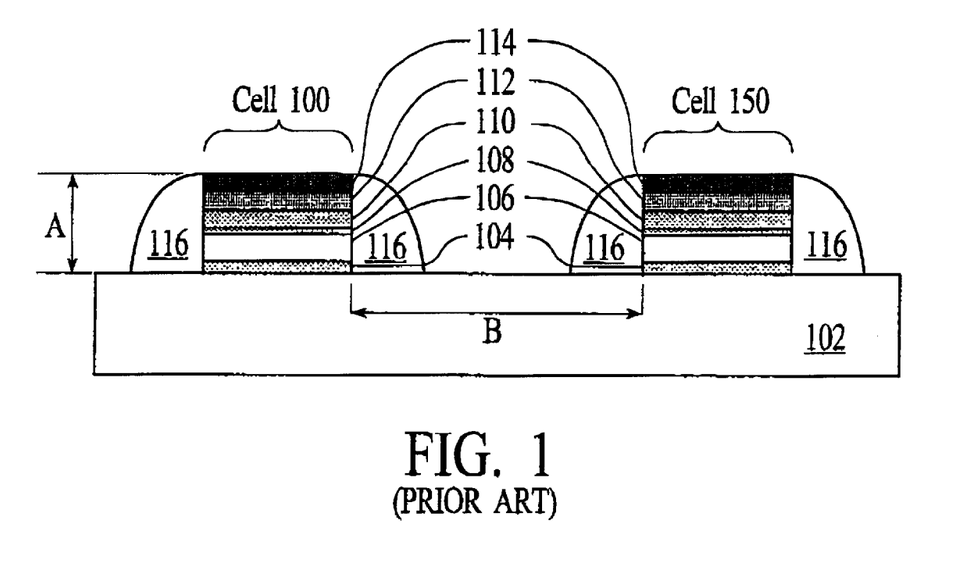
FIG. 1 illustrates cross-section of two conventional memory cells in a core area of a flash memory device.

Semiconductor memory devices include flash memory devices. FIG. 1 illustrates a cross-section of two conventional memory cells 100 and 150 in a core area of a flash memory device. The cells 100, 150 are comprised of tunnel oxides 104 on a substrate 102 and floating gates 106 composed of polysilicon on the tunnel oxide 104. The control gates comprise polysilicon layers 110 and tungsten silicide layers 112 on the polysilicon layers 110. Dielectric layers 108 insulate the floating gates 106 from the control gates 110 and 112. The control gates 110 and 112 are coupled to a word line. Cap layers 114 composed of silicon oxynitride reside on the control gates 110 and 112 and provide an anti-reflective coating at masking. To prevent charge leakage, spacers 116 comprising oxide are formed at each side of the floating gates 106. The gaps between the cells 100, 150 are filled by an oxide (118 of FIGS. 2A and 2B).

Figure 2A:
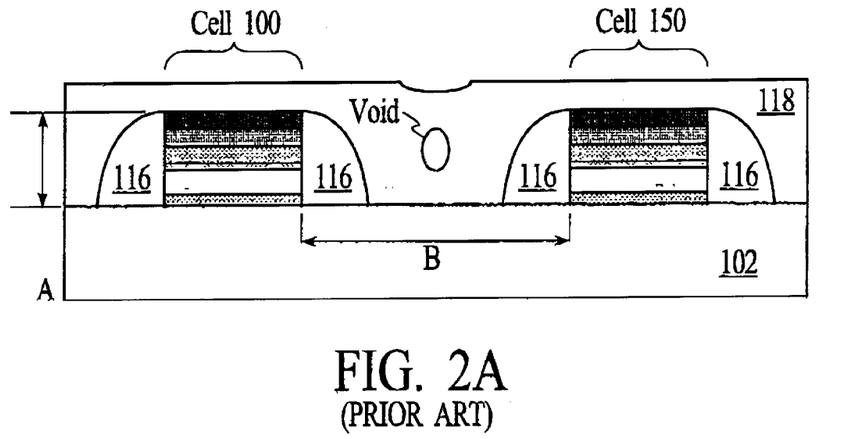
FIGS. 2A and 2B illustrates the problem of voids and seams in the gap-filling oxide in a conventional flash memory device.
Figure 2B:
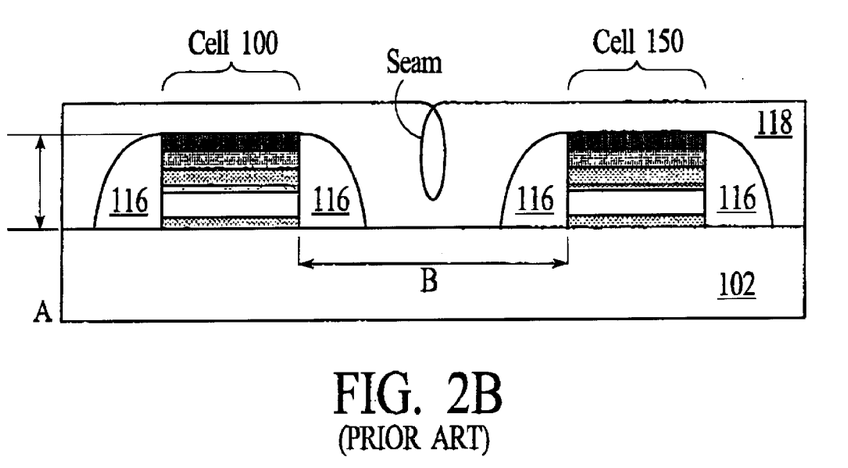

An important characteristic of the cell structure is the gate aspect ratio. Gate aspect ratio refers to the ratio of the height of the stack structures A and the distance between the stack structures of adjacent cells B, i.e., A/B. The larger the gate aspect ratio, the more difficult it is to completely fill the gap between the cells with the oxide. If the gate aspect ratio is too high, then bad step coverage by the oxide results. Bad step coverage can create voids, as illustrated in FIG. 2A, or seams, as illustrated in FIG. 2B, in the oxide 118. Voids and seams create weaknesses in the oxide film 118, reducing the reliability of the device.

Accordingly, there exists a need for a method for reducing the gate aspect ratio of a flash memory device. The method should improve the step coverage of the oxide between spacers of adjacent cells of the device. The present invention addresses such a need.

SUMMARY OF THE INVENTION

The present invention provides a method for reducing the gate aspect ratio of a flash memory device. The method includes forming a tunnel oxide layer on a substrate; forming a polysilicon layer on the tunnel oxide layer; forming an insulating layer on the polysilicon layer; forming a control gate layer on the polysilicon layer; etching at least the tunnel oxide layer, the insulating layer, and the control gate layer to form at least two stack structures; forming a plurality of spacers at sides of the at least two stack structures; and filling at least one gap between the at least two stack structures with an oxide, where the control gate layer provides a gate aspect ratio which allows for a maximum step coverage by the oxide. In a preferred embodiment, the method uses nickel silicide instead of the conventional tungsten silicide in the control gate layers of the cells of the device. Nickel silicide has higher conductivity than conventional silicides, thus a thinner layer of nickel silicide may be used without sacrificing performance. Nickel silicide also has a lower barrier height for holes, thus maintaining a low contact resistance. With a thinner nickel silicide layer, the gate ratio of the cells are lowered, allowing for a maximum step coverage by the gap-filling oxide. The reliability of the device is thus improved.

DETAILED DESCRIPTION

The present invention provides a method for reducing the gate aspect ratio of a flash memory device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 through 4J in conjunction with the discussion below.

Figure 3:
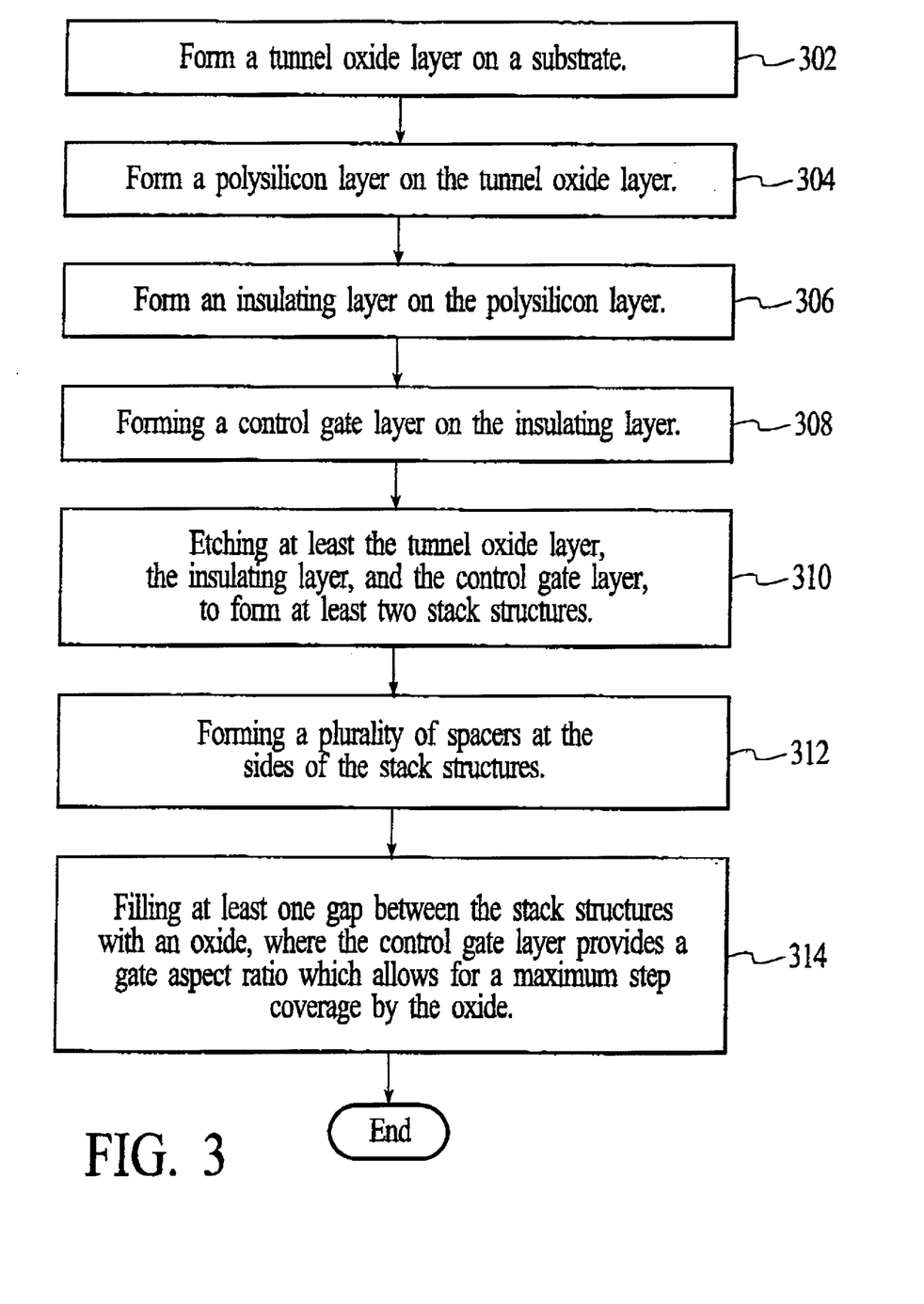
FIG. 3 is a flow chart illustrating a preferred embodiment of a method for reducing the gate aspect ratio of a flash memory device in accordance with the present invention.

FIG. 3 is a flow chart illustrating a preferred embodiment of a method for reducing the gate aspect ratio of a flash memory device in accordance with the present invention. First, a tunnel oxide layer is formed on a substrate of the device, via step 302. Next, a first polysilicon layer is formed on the tunnel oxide layer, via step 304. This first polysilicon layer becomes the floating gate of the cells. Next, an insulating layer is formed on the first polysilicon layer, via step 306, and a control gate layer is formed on the insulating layer, via step 308. At least two stack structures are then formed by etching at least the tunnel oxide layer, the insulating layer, and the control gate layer, via step 310. A plurality of spacers are then formed at the sides of the stack structures, via step 312. Then, at least one gap between the stack structures are filled with oxide, via step 314, where the control gate layer provides a gate aspect ratio which allows for a maximum step coverage by the oxide.

In the preferred embodiment, the control gate layer is provided by first forming a second polysilicon layer on the insulating layer and then a layer of silicide, preferably nickel silicide, on the second polysilicon layer. Nickel silicide has higher conductivity than the conventional tungsten silicide or other conventional silicides, since it has a lower barrier height for holes. Thus a thinner layer of nickel silicide may be used in the control gate without sacrificing conductivity. The use of nickel silicide has an additional advantage. The second polysilicon layer is typically doped with boron, arsenic or phosphorus ions. During the forming of the silicide layer, some of these ions will diffuse from the second polysilicon layer to the silicide layer, raising the contact resistance. However, this diffusion is considerably less for nickel silicide than with conventional silicides, such as tungsten silicide. Thus, the contact resistance remains low. Another advantage to nickel silicide is that silicidation can be accomplished at a low temperature, making it suitable for deep submicron processes.

Although the present invention is described with the use of nickel silicide, one of ordinary skill in the art will understand that other compounds may be used to reduce the gate aspect ratio of the device without departing from the spirit and scope of the present invention.

FIGS. 4A–4J illustrate cross-sections of a portion of a memory cell area along a bit line in demonstration of a preferred embodiment of the method for reducing the gate aspect ratio of a flash memory device in accordance with the present invention. Although only cross-sections of two memory cells are illustrated, one of ordinary skill in the art will understand that a plurality of memory cells and peripheral cells may be fabricated in a similar manner.

Figure 4A:
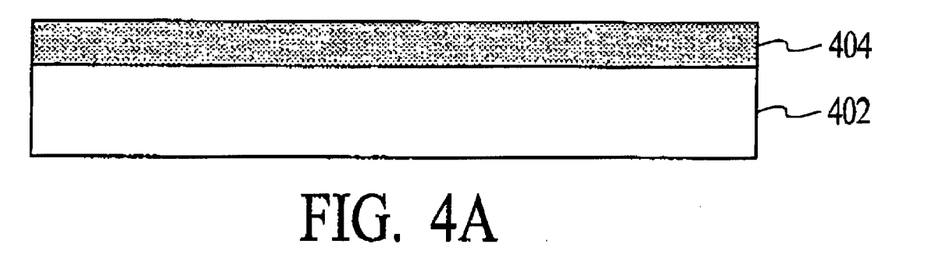
FIGS. 4A–4J illustrate cross-sections of a portion of a memory cell area along a bit line in demonstration of a preferred embodiment of the method for reducing the gate aspect ratio of a flash memory device in accordance with the present invention.

FIG. 4A illustrates the formation of the tunnel oxide layer 404 on the substrate 402, via step 302. In the preferred embodiment, approximately 87 Å of tunnel oxide 404 is grown on the substrate 402 at about 1050° C.

Figure 4B:
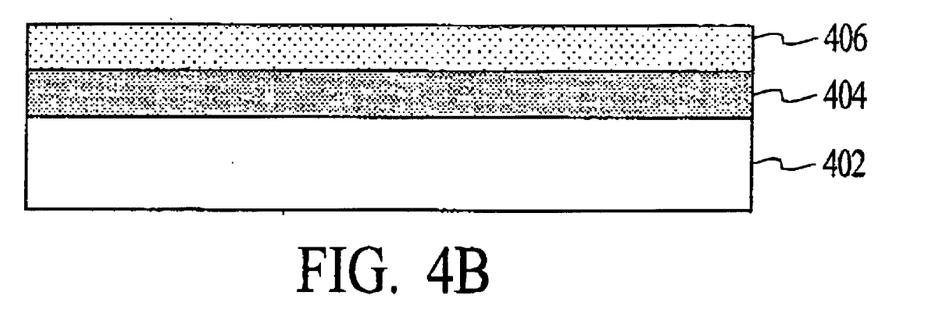

FIG. 4B illustrates the formation of the first polysilicon layer 406, via step 304. In the preferred embodiment, approximately, 900 Å of an in-situ doped amorphous silicon 406 is deposited on the tunnel oxide 402 at about 530° C. and 400 mT.

Figure 4C:
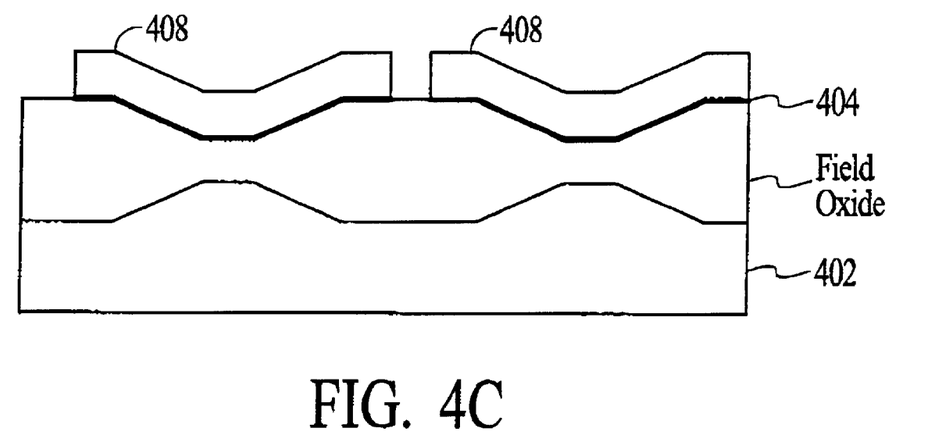

At this point, portions of the first polysilicon layer 406 is etched away to define the floating gates of the memory cells. The etch is performed at about 125 mT and 120 W with about 30 SCCM Of $Cl_2$, and 70 sccm of HBr. The result is an isolation of portions of the doped amorphous silicon layer 408 along the bit line, defining floating gates for the memory cells along the bit lines. FIG. 4C illustrates a cross-section along the word line illustrating the floating gates 408.

Figure 4D:
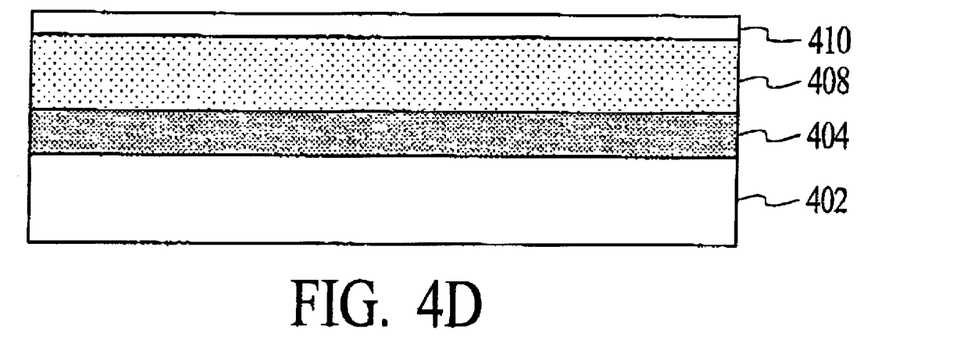

FIG. 4D illustrates the formation of the insulating layer 410, via step 306, on the first doped amorphous silicon layer 408. In the preferred embodiment, the insulating layer 410 is a dielectric layer comprised of two oxide layers with a layer of nitride sandwiched in-between, called an ONO layer. Approximately 50 Å of the first of the two oxide layers is first deposited on the doped amorphous silicon layer 408 at about 750° C. and 600 mT with about 20 cc of $SiH_4$, and 1.2 liters of $N_2O$. Then approximately 80 Å of the nitride layer is deposited at about 760° C. and 330 mT with about 600 cc of $NH_3$, and 100 cc of $SiH_2Cl_2$. The second of the two oxide layers of the dielectric layer 410 is formed using a nitride oxidation technique at about 950° C. with about 5 liters of $O_2$, and 9 liters of $H_2$ for about 40 minutes, which grows approximately 50 Å of oxide. The result is approximately 135 Å of dielectric layer 314.

Figure 4E:
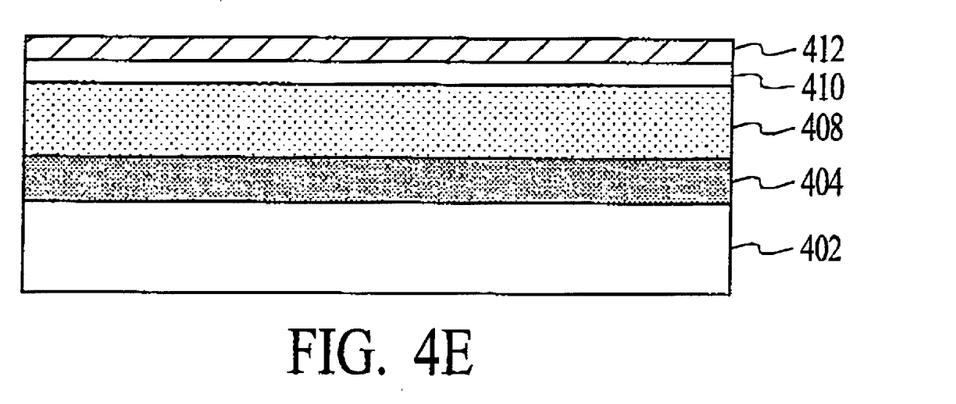
Figure 4F:
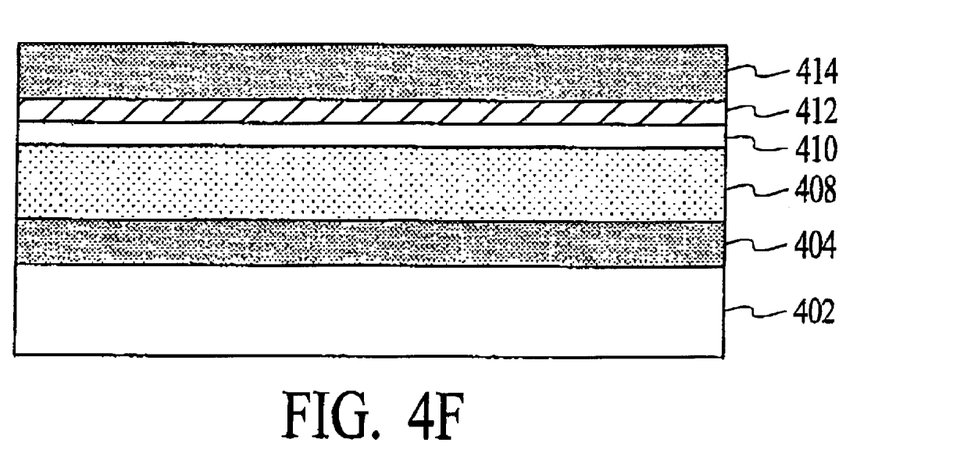

FIGS. 4E and 4F illustrate the formation of the control gate layer, via step 308. First, a second polysilicon layer 412 is deposited on the dielectric layer 410. The second polysilicon layer 412 may be comprised of doped amorphous silicon. Then, a nickel silicide layer 414 is deposited on the second polysilicon layer 412. In the preferred embodiment, approximately 1000–1200 Å of the second polysilicon layer 412 is deposited. With a second polysilicon layer comprised of doped amorphous silicon, the layer 412 is deposited using Low Pressure Chemical Vapor Deposition (LPCVD) techniques at about 530° C. and 400 mT with about 2000 sccm of $SiH_4$, and 75 sccm of a mixture of 1% by weight of $PH_3$ in He. To form the nickel silicide layer 414, a nickel film is first deposited on the second polysilicon layer 412. The nickel layer is sputtered to a desired thickness, about 400 Å.

Then, an anneal is performed on the nickel film at about 600° C. which causes the nickel film to react with the second polysilicon layer 412, forming a layer of nickel silicide 414. In the preferred embodiment, approximately 600 Å of nickel silicide 414 and about 850 Å of the second polysilicon layer 412 results.

Figure 4G:
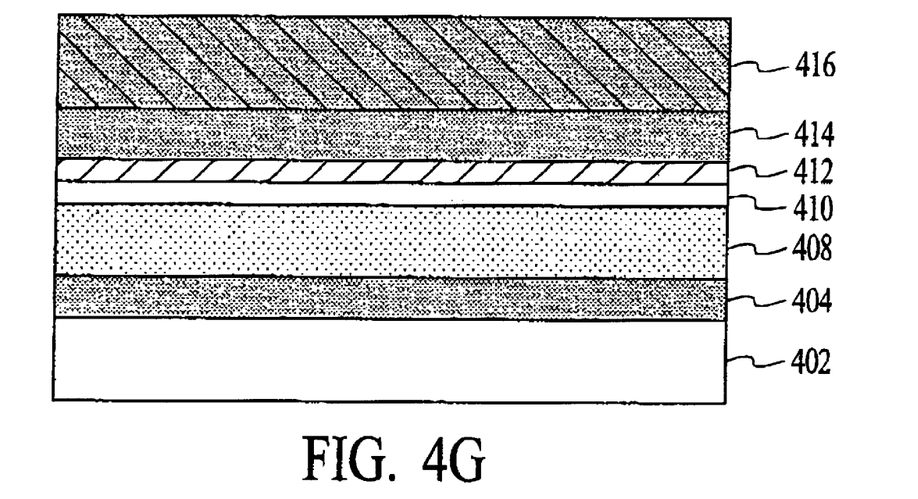

A layer of silicon oxynitride layer 416 may be deposited on the nickel silicide layer 414, as illustrated in FIG. 4G. A silicon oxynitride layer 416 with a reflectivity index between 2.0 and 2.34 is desirable. The silicon oxynitride layer 416 may also be bombarded with $N_2O$ to promote the ease of removal of any subsequent photoresist during photolithography. In the preferred embodiment, approximately 1000 Å of the silicon oxynitride layer 416 is deposited at about 400° C., 300–340 W, and 3.5 mT with about 90–110 sccm of $SiH_4$, 450–550 sccm of $N_2$, and 35–45 sccm of $N_2O$.

Figure 4H:
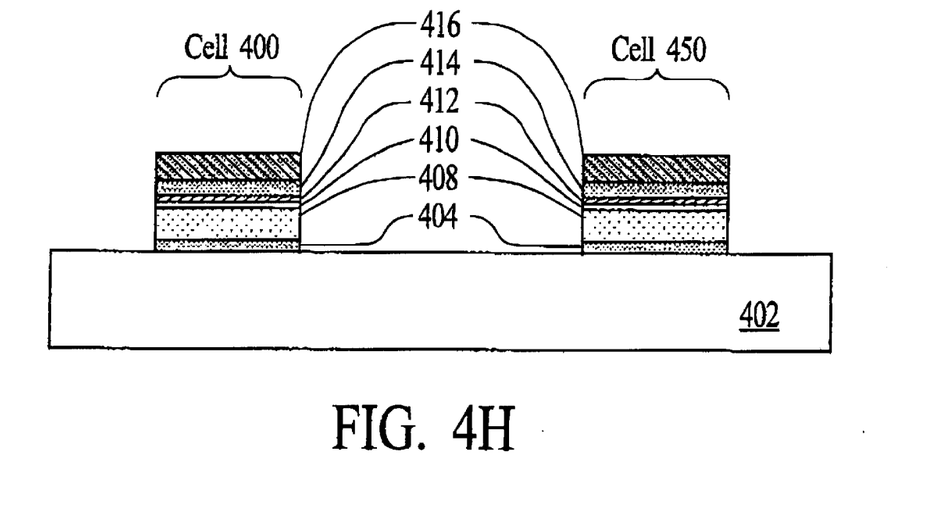

As illustrated in FIG. 4H, at least the tunnel oxide layer 404, the dielectric layer 410, the second polysilicon layer 412, the nickel silicide layer 414, and the silicon oxynitride layer 416 are etched, to form at least two stack structures 400, 450, via step 312.

Figure 4I:
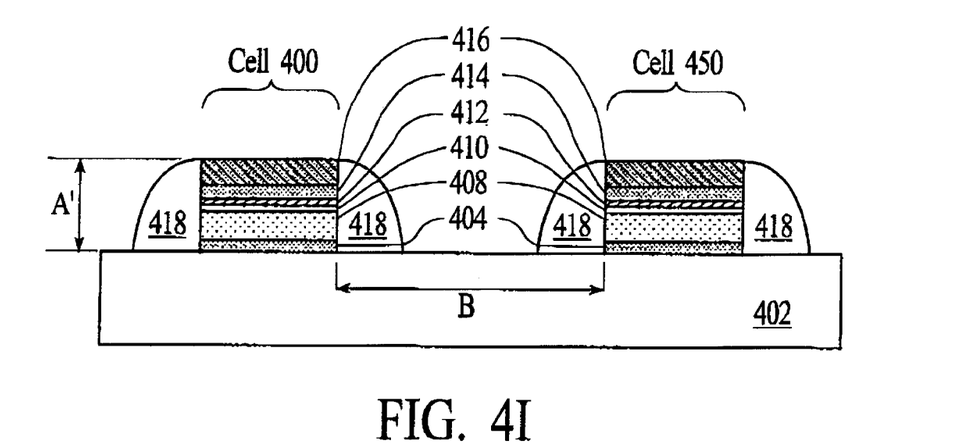
Figure 4J:
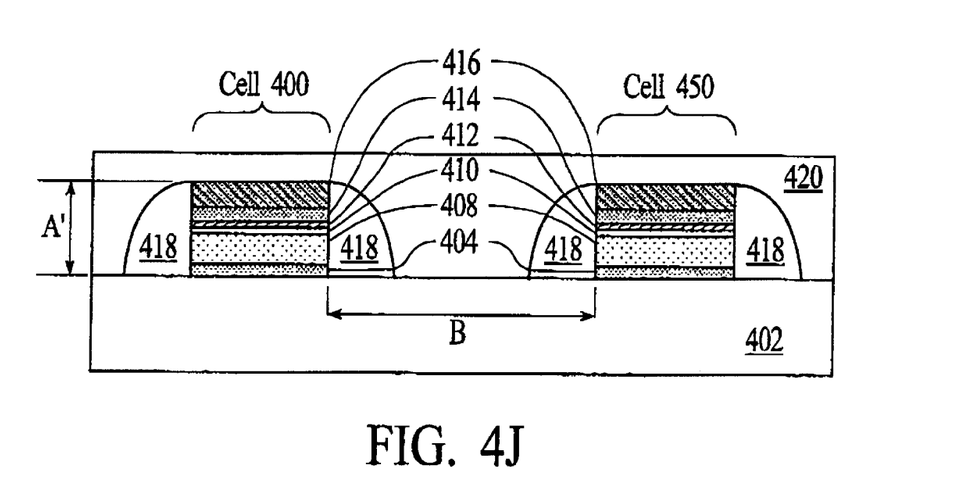

Next, as illustrated in FIG. 4I, a plurality of spacers 418 are formed at the sides of the stack structures 400, 450, via step 312. The spacers 418 are formed by first depositing oxide on the stack structures, etching the oxide so that the spacers 418 are formed, and then oxidizing the spacers at about 800° C. for about 35 minutes.

Since the resulting stack structures 400, 450 have about 850 Å of the second polysilicon layers 412 instead of the conventional 1200 Å, and because they have about 600 Å of nickel silicide layers 414 instead of the 1400 Å of the conventional tungsten silicide, the height A' of the stack structures 400, 450 is shorter. A shorter height A' leads to a smaller gate aspect ratio, A'/B.

With this smaller gate aspect ratio, a maximum step coverage is achieved in the filling of the gap between the stack structures 400, 450, via step 314. The result is a gap-filling oxide layer 420 which has minimum voids and seams, as illustrated in FIG. 4J.

A method for reducing the gate aspect ratio of a flash memory device has been disclosed. The method uses nickel silicide instead of the conventional tungsten silicide in the control gate layers of the cells of the device. Nickel silicide has higher conductivity than conventional tungsten silicide, thus a thinner layer of nickel silicide may be used without sacrificing performance. Nickel silicide also has a lower barrier height for holes, thus maintaining a low contact resistance. With a thinner nickel silicide layer, the gate aspect ratio of the cells are lowered, allowing for a maximum step coverage by the gap-filling oxide. The reliability of the device is thus improved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flash memory device, comprising:
   a substrate;
   at least two cells on the substrate, each cell comprising:
      a tunnel oxide layer on the substrate,
      a polysilicon layer on the tunnel oxide layer,
      an insulating layer on the polysilicon layer, a control gate layer on the insulating layer, wherein the control gate layer comprises:
- a second polysilicon layer on the insulating layer, wherein the second polysilicon layer is formed by growing approximately 1000–1200 Å of the second polysilicon layer on the insulating layer using Low Pressure Chemical Vapor Deposition (LPCVD) techniques at about 530° C. and 400 mT with about 2000 sccm of $SiH_4$ and 75 sccm of a mixture of 1% by weight of $PH_3$ in He, and
- a nickel silicide layer on the second polysilicon layer, and
- a plurality of spacers; and a gap-filling oxide between the at least two cells, wherein the control gate layer provides a gate aspect ratio which allows for a maximum step coverage by the gap-filling oxide.

2. A flash memory device, comprising:

a substrate;

at least two cells on the substrate, each cell comprising:
- a tunnel oxide layer on the substrate,
- a polysilicon layer on the tunnel oxide layer,
- an insulating layer on the polysilicon layer,
- a control gate layer on the insulating layer, wherein the control gate layer comprises:
  - a second polysilicon layer on the insulating layer; and
  - a nickel silicide layer on the second polysilicon layer wherein the nickel silicide layer is formed by sputtering approximately 400 Å of nickel on the second polysilicon layer; and annealing the nickel at about 600° C., wherein approximately 600 Å of the nickel silicide layer and approximately 850 Å of the second polysilicon layer are formed, and
- a plurality of spacers; and a gap-filling oxide between the at least two cells, wherein the control gate layer provides a gate aspect ratio which allows for a maximum step coverage by the gap-filling oxide.

\* \* \* \* \*